United States Patent [19]

Galasso et al.

[11] 4,289,801

[45] Sep. 15, 1981

[54] METHOD FOR PRODUCING FINE GRAINED PYROLYTIC SILICON NITRIDE

[75] Inventors: Francis S. Galasso, Manchester, Conn.; Malcolm Basche, deceased, late of West Hartford, Conn., by Joyce O. Basche, heir

[73] Assignee: United Technologies Corporation, Hartford, Conn.

[21] Appl. No.: 149,820

[22] Filed: May 21, 1980

[51] Int. Cl.³ .......................... C01B 21/06; B05D 5/12
[52] U.S. Cl. ...................................... 427/94; 423/344; 423/406
[58] Field of Search ................... 423/344, 406; 427/94

[56] References Cited

U.S. PATENT DOCUMENTS

| | | | |
|---|---|---|---|
| 3,211,527 | 10/1965 | Forsyth | 423/344 |
| 3,226,194 | 12/1965 | Kuntz | 423/344 X |
| 3,565,674 | 2/1971 | Boland et al. | 423/344 X |
| 3,637,423 | 1/1972 | Sestrich | 427/94 X |
| 4,036,653 | 7/1977 | Jacobson | 423/344 X |
| 4,091,169 | 5/1978 | Bohg et al. | 427/94 X |
| 4,118,539 | 10/1978 | Hirai et al. | 427/94 X |

*Primary Examiner*—Jack Cooper
*Attorney, Agent, or Firm*—Charles E. Sohl

[57] ABSTRACT

Novel fine grained pyrolytic silicon nitride is produced by adding a substantial amount of methane to the normal reactant gases. Silicon tetrafluoride and ammonia in ratios of 60:40 to 10:90 may be employed with additions of methane in amounts equal to from 50 to 500% of the sum of silicon tetrafluoride and ammonia. When these reactant gases are passed over a heated substrate at a low pressure pyrolytic silicon nitride with a grain size of less than about 10 microns results.

6 Claims, No Drawings

METHOD FOR PRODUCING FINE GRAINED PYROLYTIC SILICON NITRIDE

DESCRIPTION

1. Technical Field

This invention concerns a method for producing fine grained pyrolytic silicon nitride and the resultant product.

2. Background Art

It is known in the art to produce pyrolytic silicon nitride by a reaction of various gas mixtures at elevated temperatures on a substrate. Typical of this art is that described in U.S. Pat. No. 3,226,194 by Kuntz, which is assigned to the present assignee.

This patent describes the production of pyrolytic silicon nitride by the passage of a gas mixture containing a silicon halide and ammonia at a reduced pressure over a heated surface. The preferred gas composition is from about 50 to about 85% ammonia and held at a temperature between about 1200° C. and 1900° C. It is preferred that the combined partial pressure of these gases be less than 300 mm of Hg, more preferably less than 100 mm of Hg and most preferably less than 10 mm of Hg. Through the use of this process, silicon nitride deposition rates about $7 \times 10^{-3}$ in./hr. may be obtained and the resultant silicon nitride coating is hard, dense and resistant to chemical attack.

DISCLOSURE OF THE INVENTION

According to the present invention, the grain size of pyrolytic silicon nitride deposited from silicon halide-ammonia mixtures is substantially reduced by the incorporation of a substantial amount of methane into the gas mixture without otherwise changing the parameters of the reaction or the properties of the resultant silicon nitride.

In particular, the resultant silicon nitride does not contain any free carbon particles. By reducing the grain size of the silicon nitride, its strength and toughness are improved.

The silicon halide and ammonia may be present in amounts from 40-90% ammonia, balance silicon tetrafloride and preferably from 50-85% ammonia, balance silicon tetrafloride. To this mixture of reactant gases, there is added an amount of methane equal to from about 50-500% of the total of silicon tetrafloride plus ammonia.

BEST MODE FOR CARRYING OUT THE INVENTION

This invention relates to a method for substantially reducing the grain size of pyrolytic silicon nitride. The production of pyrolytic silicon nitride is described in U.S. Pat. No. 3,226,194 which is expressly incorporated herein by reference.

This patent describes how pyrolytic reaction silicon nitride may be produced by passing a gas mixture of a silicon halide and ammonia over a heated surface. The gas mixtures are maintained at a reduced partial pressure, less than 300 mm, preferably less than 100 mm and most preferably less than 10 mm of Hg, and is maintained at an elevated temperature of from about 1200° to about 1900° C.

When a gas mixture of this composition at this temperature and pressure is passed over a heated surface, pyrolytic silicon nitride is deposited on the heated surface. The resultant pyrolytic silicon nitride typically has a grain size from about 20 to about 60 microns. Some change in the average grain size within this range may be obtained by changing the various parameters of the process such as gas ratios, flow rates and substrate temperatures, but the changes in grain size are not substantial, and we are not aware that pyrolytic silicon nitride with a grain size of less than about 10 microns has ever been produced.

We have found that a surprising and unexpected reduction in grain size may be obtained in the above-identified process through the incorporation of a substantial amount of methane into the gas mixture. In particular, methane flow rates of 100 to 500% of the total flow rate of silicon halide plus ammonia can reduce the pyrolytic silicon nitride grain size to about one or two microns. This reduced grain size produces benefits in the silicon nitride which include improved strength and toughness especially in the plane of the substrate surface.

The preferred gas constituents for the present process are silicon tetrafloride and ammonia. Other silicon halide may be employed but the deposition rates with these halides will produce polymers which can plug up the apparatus. The ammonia should be 40-90% and preferably from 50 to 85% of the total of the silicon halide and ammonia.

The preferred pressure of the gases over the substrate is less than 100 mm of Hg and preferably from 1 to 10 mm of Hg. The preferred temperature of this gas stream is from about 1200° to 1900° C. and preferably from 1200° to 1600° C. and the substrate is also maintained at a temperature within this range. When gas mixtures containing silicon tetrafloride are employed within the temperature and pressure ranges set forth above deposition rates from about 1 to about 10 mils/hr. may be obtained. Proper mixing of these gases has been shown to be essential if uniform silicon nitride grain size is to be obtained. Best results have been obtained by flowing the gases through a passage over graphite rods to induce turbulant mixing before the gas enters the reaction chamber. This invention will be clarified through reference to the following illustrative examples.

EXAMPLE 1

A mixture of 38 cc/min. of $NH_3$ and 20 cc/min. of silicon tetrafloride (65% ammonia and 35% silicon tetrafloride) was introduced into a reaction chamber along with 130 cc/min. of methane.

A carbon substrate heated at 1400° C. was maintained in the chamber and the chamber pressure was held between 1 and 2 mm of Hg. The grain size of the resultant pyrolytic silicon nitride was 1 to 2 microns. Similar experiments conducted without the addition of methane produced pyrolytic silicon nitride with a grain size of about 40 microns. In this example, the addition of methane in an amount of 230% of the total of the reactant gases was found to reduce the grain size by a factor of about 20.

EXAMPLE 2

The same combination of silicon tetrafloride and ammonia that was described in Example 1 was employed in a chamber maintained at the same pressure and temperature. To this mixture is was added 201 cc of methane and a similar pyrolytical silicon nitride and a grain size of 1 to 2 microns was produced. This methane addition constituted 350% of the reactive gases.

EXAMPLE 3

118 cc/min. of ammonia and 20 cc/min. silicon tetrafloride was employed as a reactant gas (15% $SiF_4$, 85% $NH_3$). To this mixture there was added 201 cc/min. of methane. This gas mixture was passed over a carbon substrate which was held at 1400° C. at a reaction chamber which was held at 1 to 2 mm of Hg. Again the grain size of the resultant pyrolytic silicon was in the range of 1 to 2 microns. Xray defractions analysis and optic microscopy of the silicon nitride produced in this example did not reveal the presence of any carbon in the silicon nitride.

Other experiments performed using ethane in place of methane in amounts of from 150 to 400% of the silicon tetrafloride plus ammonia mixture (35% silicon tetrafloride and 65% ammonia) generally reduced the grain size of the silicon nitride but the resultant pyrolytic silicon nitride contain substantial amounts of pyrolytic carbon particles. These carbon particles are believed to be highly detrimental to the mechanical properties and the oxidation resistance of pyrolytic material, consequently, it is not believed that carbon containing gases other than methane are satisfactory.

What is claimed is:

1. A method for producing fine grain pyrolytic silicon nitride which comprises: providing reactant gases which comprise from 40 to 90% ammonia, balance silicon halide and an amount of methane equal to from about 50 to 500% of the reactant gases, mixing these gases and flowing them into a reaction chamber which contains a substrate, said reaction chamber and substrate being heated to from 1200° to 1900° C. and said reaction chamber being maintained at a partial pressure of less than 300 mm of Hg of reactant gases, so that fine grained pyrolytic silicon nitride free of carbon and having a grain size less than about 10 microns is deposited on the substrate.

2. A method as in claim 1 wherein the ammonia is present in an amount equal to from 50 to 85% of the reactant gases.

3. A method as in claim 1 wherein the methane is added in amounts of from about 150 to 400% of the reactant gases.

4. A method as in claim 1 wherein the reaction chamber and substrate temperature is held between 1200° and 1600° C.

5. A method as in claim 1 wherein the reaction chamber partial pressure of reactant gases is less than 100 mm of Hg.

6. A method as in claim 1 wherein the reaction chamber partial pressure of reactant gas is from 1 to 10 mm of Hg.

* * * * *